US008432653B2

(12) United States Patent
Adachi et al.

(10) Patent No.: US 8,432,653 B2
(45) Date of Patent: Apr. 30, 2013

(54) ESD PROTECTION DEVICE

(75) Inventors: Jun Adachi, Koga (JP); Jun Urakawa, Omihachiman (JP); Takahiro Sumi, Omihachiman (JP); Takahiro Kitadume, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/153,589

(22) Filed: Jun. 6, 2011

(65) Prior Publication Data

US 2011/0227196 A1 Sep. 22, 2011

Related U.S. Application Data

(63) Continuation of application No. PCT/JP2009/005466, filed on Oct. 19, 2009.

(30) Foreign Application Priority Data

Dec. 10, 2008 (JP) ................................ 2008-314705

(51) Int. Cl.
*H01L 29/00* (2006.01)
*H02H 9/00* (2006.01)
*H02H 7/20* (2006.01)
*H02H 1/00* (2006.01)

(52) U.S. Cl.
USPC .............. 361/56; 361/120; 361/112; 257/537

(58) Field of Classification Search .................. 257/173, 257/355, 537; 361/15, 18, 19, 56, 91.1, 112, 361/120
See application file for complete search history.

(56) References Cited

U.S. PATENT DOCUMENTS 4,317,155 A * 2/1982 Harada et al. ................ 361/120
6,721,157 B2 * 4/2004 Shin ............................. 361/120
2007/0285866 A1 * 12/2007 Ueda et al. .................... 361/120
2009/0067113 A1 3/2009 Urakawa

FOREIGN PATENT DOCUMENTS

EP 2 242 154 A1 10/2010
JP 03-194878 * 8/1991
JP 03-194878 A 8/1991
JP 03-124585 U 12/1991
JP 03-124585 * 12/1997
JP 2001-043954 A 2/2001
JP 2006-134694 A 5/2006
JP 2008-010278 A 1/2008

(Continued)

OTHER PUBLICATIONS

Official Communication issued in International Patent Application No. PCT/JP2009/005466, mailed on Dec. 22, 2009.

(Continued)

*Primary Examiner* — Julio J Maldonado
*Assistant Examiner* — Harpreet Singh
(74) *Attorney, Agent, or Firm* — Keating & Bennett, LLP

(57) ABSTRACT

An ESD protection device includes a ceramic multilayer substrate, at least one pair of discharge electrodes provided in the ceramic multilayer substrate and facing each other with a space formed therebetween, external electrodes provided on a surface of the ceramic multilayer substrate and connected to the discharge electrodes. The ESD protection device includes a supporting electrode obtained by dispersing a metal material and a semiconductor material and being arranged in a region that connects the pair of discharge electrodes to each other.

7 Claims, 3 Drawing Sheets

FOREIGN PATENT DOCUMENTS

| | | | |
|---|---|---|---|
| JP | 2008-21883 | * | 1/2008 |
| JP | 2008-021883 | A | 1/2008 |
| WO | 2008/146514 | A1 | 12/2008 |
| WO | WO 2008/146514 | * | 12/2008 |
| WO | 2009/098944 | A1 | 8/2009 |

OTHER PUBLICATIONS

Yamamoto et al., "ESD Protection Device,", U.S. Appl. No. 13/112,059, filed May 20, 2011.

Adachi et al., "ESD Protection Device and Method for Manufacturing the Same,", U.S. Appl. No. 13/115,221, filed May 25, 2011.

Adachi et al., "ESD Protection Device and Method for Manufacturing the Same,", U.S. Appl. No. 13/113,111, filed May 23, 2011.

Official Communication issued in corresponding Japanese Patent Application No. 2010-510596, mailed on Jun. 28, 2012.

Official Communication issued in corresponding European Patent Application No. 09831612.8, mailed on Feb. 6, 2013.

* cited by examiner

ESD PROTECTION DEVICE

BACKGROUND OF THE INVENTION

1. Field of the Invention

The present invention relates to an electrostatic discharge (ESD) protection device, and particularly to technologies for preventing breakdown and deformation of a ceramic multilayer substrate caused by, for example, cracking in an ESD protection device that includes discharge electrodes that face each other in a cavity of the ceramic multilayer substrate.

2. Description of the Related Art

ESD is a phenomenon in which strong discharge is generated when a charged conductive body (e.g., human body) comes into contact with or comes sufficiently close to another conductive body (e.g., electronic device). ESD causes damage or malfunctioning of electronic devices. To prevent this, it is necessary to prevent the application of an excessively high voltage generated during discharge to circuits of the electronic devices. ESD protection devices, which are also called surge absorbers, are used for such an application.

An ESD protection device is disposed, for instance, between a signal line and a ground of the circuit. The ESD protection device includes a pair of discharge electrodes that face each other with a space therebetween. Therefore, the ESD protection device has high resistance under normal operation and a signal is not sent to the ground. An excessively high voltage, for example, generated by static electricity through an antenna of a mobile phone or other device causes discharge between the discharge electrodes of the ESD protection device, which leads the static electricity to the ground. Thus, a voltage generated by static electricity is not applied to the circuits disposed downstream from the ESD protection device, which protects the circuits.

For example, an ESD protection device shown in an exploded perspective view of FIG. 5 and a sectional view of FIG. 6 includes a cavity 5 provided in a ceramic multilayer substrate 7 made by laminating insulating ceramic sheets 2. Discharge electrodes 6 that face each other and that are electrically connected to external electrodes 1 are disposed in the cavity 5 that includes discharge gas. When a breakdown voltage is applied between the discharge electrodes 6, discharge is generated between the discharge electrodes 6 in the cavity 5, which leads an excessive voltage to the ground. Consequently, the circuits disposed downstream from the ESD protection device are protected (see, for example, Japanese Unexamined Patent Application Publication No. 2001-43954).

However, there are problems with such an ESD protection device.

In the ESD protection device shown in FIGS. 5 and 6, the responsivity to ESD easily varies due to the variation in the space between the discharge electrodes. Furthermore, although the responsivity to ESD can be adjusted by changing an area of the region between discharge electrodes that face each other, the amount of adjustment is limited due to the size of the product. Therefore, it can be difficult to achieve the desired responsivity to ESD.

SUMMARY OF THE INVENTION

To overcome the problems described above, preferred embodiments of the present invention provide an ESD protection device whose ESD characteristics are easily adjusted and stabilized.

An ESD protection device according to a preferred embodiment of the present invention preferably includes a ceramic multilayer substrate, at least one pair of discharge electrodes provided in the ceramic multilayer substrate and facing each other with a space therebetween, external electrodes provided on a surface of the ceramic multilayer substrate and connected to the discharge electrodes. The ESD protection device preferably includes a supporting electrode obtained by dispersing a metal material and a semiconductor material and arranged in a region that connects the pair of discharge electrodes to each other.

With the structure described above, when a voltage equal to or greater than a certain voltage is applied between the external electrodes, discharge is generated between the discharge electrodes that face each other. The discharge is generated along a region that connects the pair of discharge electrodes to each other. Since the ESD protection device preferably includes the supporting electrode obtained by dispersing a metal material and a semiconductor material and optionally a resistive material therein in the region that connects the pair of discharge electrodes to each other, electrons easily move and discharge is generated more efficiently. As a result, the responsivity to ESD is effectively improved. This decreases the variation in the responsivity to ESD due to the variation in the space between the discharge electrodes. Thus, ESD characteristics are easily adjusted and stabilized.

Furthermore, by adjusting the amounts and types of the metal material and the semiconductor material and optionally the resistive material included in the supporting electrode, the discharge starting voltage can be easily set to a desired voltage. The discharge starting voltage can be set with high precision as compared to the case in which a discharge starting voltage is adjusted using only the space between the discharge electrodes.

The semiconductor material is preferably silicon carbide (SiC) or silicon, for example.

A ceramic material that includes, as a component, a material defining the ceramic multilayer substrate is preferably also dispersed in the supporting electrode.

In this case, by dispersing a ceramic material including the same component as that of the material defining the ceramic multilayer substrate in the supporting electrode, the adhesiveness of the supporting electrode to the ceramic multilayer substrate is improved and the supporting electrode is not easily detached during firing. The ESD cyclic durability is also improved.

The supporting electrode preferably includes the metal material having a content in a range of about 10 vol % to about 50 vol %, for example.

When the content of the metal material in the supporting electrode is about 10 vol % or more, the shrinkage starting temperature of the supporting electrode during firing can be adjusted to an intermediate value between the shrinkage starting temperatures of the ceramic multilayer substrate and the discharge electrodes. When the content of the metal material in the supporting electrode is about 50 vol % or less, short circuits established between the discharge electrodes are effectively prevented.

The ceramic multilayer substrate preferably includes a cavity therein and the discharge electrodes are preferably arranged along an inner surface of the cavity.

In this case, the discharge generated between the discharge electrodes by applying a voltage equal to or greater than a certain voltage between the external electrodes is primarily a creeping discharge that is generated along an interface between the cavity and the ceramic multilayer substrate. Since the supporting electrode is preferably arranged along the interface, that is, the inner surface of the cavity, electrons easily move and discharge is generated more efficiently. As a result, the responsivity to ESD is improved. This decreases the variation in the responsivity to ESD due to the variation in the space between the discharge electrodes. Thus, ESD characteristics are easily adjusted and stabilized.

The ceramic multilayer substrate is preferably obtained by alternately laminating first ceramic layers that are not substantially sintered and second ceramic layers that have been sintered.

In this case, the ceramic multilayer substrate is preferably a non-shrinkage substrate in which the shrinkage in an in-plane direction of the second ceramic layers is prevented by the first ceramic layers during firing. In the non-shrinkage substrate, almost no warpage and size variation in the in-plane direction are produced. When the non-shrinkage substrate is used for the ceramic multilayer substrate, the space between the discharge electrodes that face each other can be provided with high precision. Consequently, characteristic variations, such as discharge starting voltage, are minimized.

The ESD characteristics of the ESD protection device of preferred embodiments of the present invention are easily adjusted and stabilized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Examples of preferred embodiments of the present invention will be described with reference to FIGS. 1 to 4.

Example 1

Figure 1:
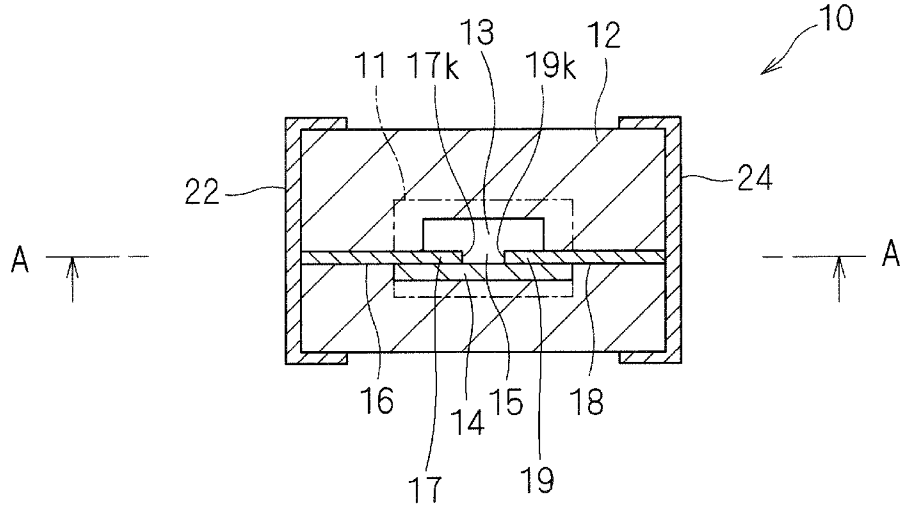
FIG. 1 is a sectional view of an Example 1 of an ESD protection device according to a preferred embodiment of the present invention.
Figure 2:
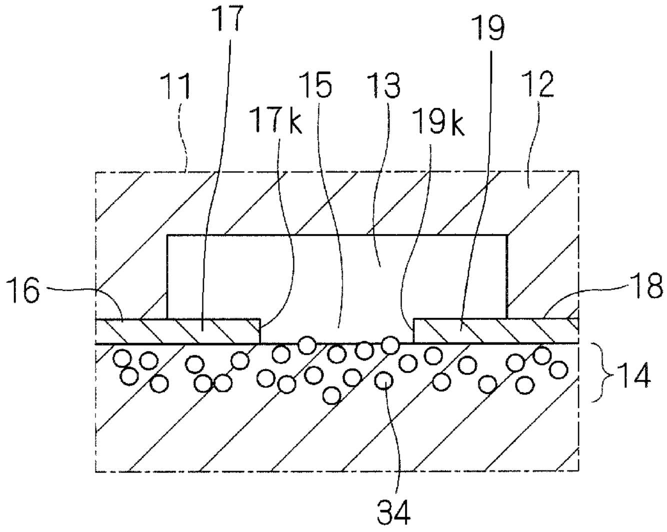
FIG. 2 is an enlarged sectional view of a principal portion of the ESD protection device according to Example 1.
Figure 3:
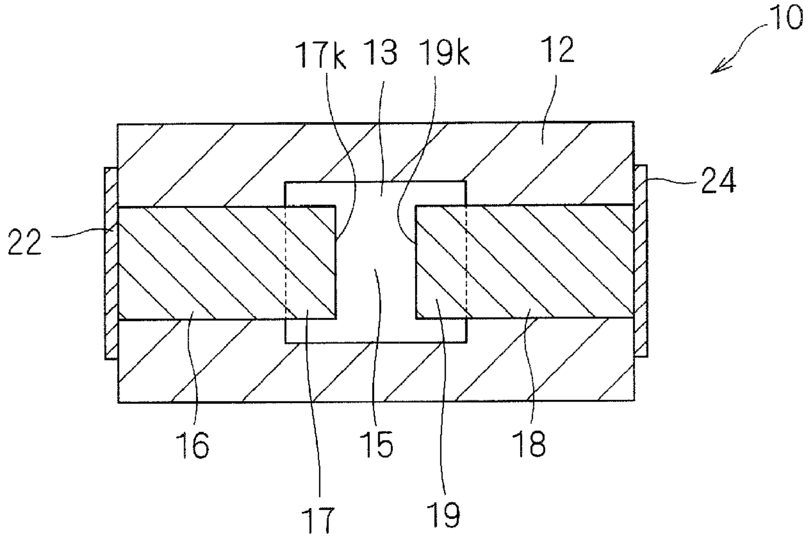
FIG. 3 is a sectional view taken along line A-A of FIG. 1.

An ESD protection device 10 of Example 1 will be described with reference to FIGS. 1 to 3. FIG. 1 is a sectional view of the ESD protection device 10. FIG. 2 is an enlarged sectional view of a principal portion schematically showing a region 11 indicated by a chain line of FIG. 1. FIG. 3 is a sectional view taken along line A-A of FIG. 1.

As shown in FIG. 1, the ESD protection device 10 preferably includes a cavity 13 and a pair of discharge electrodes 16 and 18 provided in a ceramic multilayer substrate 12. The discharge electrodes 16 and 18 preferably respectively include counter portions 17 and 19 arranged along the inner surface of the cavity 13. The discharge electrodes 16 and 18 extend from the cavity 13 to the outer circumferential surface of the ceramic multilayer substrate 12, and are respectively connected to external electrodes 22 and 24 provided on outer surfaces of the ceramic multilayer substrate 12.

As shown in FIG. 3, edges 17*k* and 19*k* of the portions 17 and 19 of the discharge electrodes 16 and 18 face each other with a space 15 provided therebetween. When a voltage equal to or greater than a certain voltage is applied between the external electrodes 22 and 24, discharge is generated between the counter portions 17 and 19 of the discharge electrodes 16 and 18.

As shown in FIG. 1, a supporting electrode 14 is preferably arranged in the periphery of the cavity 13 so as to be adjacent to the counter portions 17 and 19 of the discharge electrodes 16 and 18 and to the space 15 between the counter portions 17 and 19. In other words, the supporting electrode 14 preferably arranged in a region that connects the discharge electrodes 16 and 18 to each other. The supporting electrode 14 is in contact with the counter portions 17 and 19 of the discharge electrodes 16 and 18 and the ceramic multilayer substrate 12. As schematically shown in FIG. 2, the supporting electrode 14 preferably includes a metal material 34, a semiconductor material (not shown), and a ceramic material (not shown), for example. The metal material 34, the semiconductor material, and the ceramic material are each dispersed, and the supporting electrode 14 has an overall insulating property.

Some of the materials define the ceramic multilayer substrate 12 or all of the materials defining the ceramic multilayer substrate 12 may preferably be included as a component of the ceramic material defining the supporting electrode 14. By using the same materials as those of the ceramic multilayer substrate 12, the shrinkage behavior and/or other characteristics of the supporting electrode 14 can be easily matched with that of the ceramic multilayer substrate 12, which improves the adhesiveness of the supporting electrode 14 to the ceramic multilayer substrate 12. Consequently, detachment of the supporting electrode 14 is prevented from occurring during firing. The ESD cyclic durability is also improved. Furthermore, the number of types of materials used can be decreased.

In particular, when the ceramic material included in the supporting electrode 14 is the same as a ceramic material of the ceramic multilayer substrate 12 and they cannot be differentiated, the supporting electrode 14 preferably includes only the metal material 34 and the semiconductor material.

The metal material 34 included in the supporting electrode 14 may be the same as a material of the discharge electrodes 16 and 18 or different from the material of the discharge electrodes 16 and 18. By using the same material, the shrinkage behavior and/or other characteristics of the supporting electrode 14 can be easily matched with that of the discharge electrodes 16 and 18, which decreases the number of types of materials used.

Since the supporting electrode 14 includes the metal material 34 and the ceramic material, the shrinkage behavior of the supporting electrode 14 during firing is preferably controlled to be an intermediate shrinkage behavior between that of the ceramic multilayer substrate 12 and that of the discharge electrodes 16 and 18 including the counter portions 17 and 19. Thus, the difference in shrinkage behavior during firing between the ceramic multilayer substrate 12 and the counter portions 17 and 19 of the discharge electrodes 16 and 18 can be reduced by using the supporting electrode 14. As a result, failure due to, for example, detachment of the counter portions 17 and 19 of the discharge electrodes 16 and 18 or characteristic variation are prevented. In addition, variations in characteristics, such as discharge starting voltage, are prevented because the variation of the space 15 between the counter portions 17 and 19 of the discharge electrodes 16 and 18 is prevented.

The coefficient of thermal expansion of the supporting electrode 14 can be adjusted to an intermediate value between that of the ceramic multilayer substrate 12 and that of the discharge electrodes 16 and 18. Thus, the difference in a coefficient of thermal expansion between the ceramic multilayer substrate 12 and the counter portions 17 and 19 of the discharge electrodes 16 and 18 is reduced by using the supporting electrode 14. As a result, failure due to, for example, detachment of the counter portions 17 and 19 of the discharge electrodes 16 and 18 or the changes of characteristics over time, is prevented.

By adjusting the amounts and types of the metal material 34 and the semiconductor material included in the supporting electrode 14, the discharge starting voltage can be easily set to be a desired voltage. The discharge starting voltage can be set with high precision as compared to the case in which a discharge starting voltage is adjusted using only the space 15 between the counter portions 17 and 19 of the discharge electrodes 16 and 18.

In this preferred embodiment, the supporting electrode 14 preferably includes not only the metal material 34 but also the semiconductor material. Thus, even if the content of the metal material is relatively low, a desired responsivity to ESD is achieved. Short circuits caused by contact between metal materials are also prevented.

A manufacturing example of the ESD protection device 10 will now be described.

(1) Preparation of Materials

A material primarily including Ba, Al, and Si, for example, was used as a ceramic material of the ceramic multilayer substrate 12. Raw materials were prepared and mixed so as to have a desired composition, and then calcined at about 800° C. to about 1000° C. The calcined powder was pulverized into ceramic powder using a zirconia ball mill for about 12 hours. The ceramic powder was mixed with an organic solvent, such as toluene or EKINEN, for example. The mixture was further mixed with a binder and a plasticizer to obtain slurry. The slurry was formed into ceramic green sheets preferably having a thickness of about 50 μm by a doctor blade method, for example.

An electrode paste to form the discharge electrodes 16 and 18 was prepared. Specifically, a solvent was added to about 80 wt % Cu powder having an average particle size of about 1.5 μm and a binder resin including ethyl cellulose, for example. The admixture was then stirred and mixed using a roll to obtain an electrode paste.

To obtain a mixture paste to form the supporting electrode 14, Cu powder having an average particle size of about 3 μm and silicon carbide (SiC) having an average particle size of about 1 μm, for example, were mixed in a certain ratio as a metal material and a semiconductor material, respectively. A binder resin and a solvent were added to the admixture, and the admixture was then stirred and mixed using a roll. The mixture paste was prepared preferably so as to include about 20 wt % of the binder resin and the solvent and about 80 wt % of the Cu powder and silicon carbide, for example.

Table 1 shows the ratio of silicon carbide/Cu powder in each mixture paste.

TABLE 1

| Volume ratio of silicon carbide/Cu powder | | |
|---|---|---|
| | Volume ratio (vol %) | |
| Paste No. | Silicon carbide powder | Cu powder |
| *1 | 100 | 0 |
| 2 | 90 | 10 |
| 3 | 80 | 20 |
| 4 | 70 | 30 |
| 5 | 60 | 40 |
| 6 | 50 | 50 |
| 7 | 40 | 60 |
| 8 | 30 | 70 |
| 9 | 20 | 80 |
| 10 | 10 | 90 |
| *11 | 0 | 100 |

*Outside the scope of the present invention

A resin paste to form the cavity 13 was produced in substantially the same manner. The resin paste included only a resin and a solvent. A resin material that is decomposed or eliminated through firing was used. Examples of the resin material include PET, polypropylene, ethyl cellulose, and an acrylic resin.

(2) Application of Mixture Paste, Electrode Paste, and Resin Paste by Screen Printing The mixture paste was applied to a ceramic green sheet in a desired pattern by screen printing to form the supporting electrode 14. When the mixture paste is thick, a depression disposed in the ceramic green sheet in advance may preferably be filled with the mixture paste of silicon carbide/Cu powder.

The electrode paste was applied to the mixture paste by screen printing, for example, to form the discharge electrodes 16 and 18 having the space 15 that is a discharge gap between the portions 17 and 19. In this manufacturing example, the width of the discharge electrodes 16 and 18 was preferably about 100 μm and the discharge gap width (the size of the space 15 between the counter portions 17 and 19) was preferably about 30 μm, for example. The resin paste was then applied to the electrode paste by screen printing to form the cavity 13.

(3) Lamination and Press-Bonding

Ceramic green sheets were laminated and press-bonded in substantially the same manner as typical ceramic multilayer substrates. In this manufacturing example, a laminated body having a thickness of about 0.3 mm was formed such that the cavity 13 and the counter portions 17 and 19 of the discharge electrodes 16 and 18 were arranged in the approximate center of the laminated body.

(4) Cutting and Application of Electrode to End Surface

The laminated body was cut into chips using a microcutter in substantially the same manner as chip-type electronic components, such as LC filters. In this manufacturing example, the laminated body was cut into chips preferably having a size of about 1.0 mm×about 0.5 mm, for example. Subsequently, the external electrodes 22 and 24 were formed by applying the electrode paste to the end surfaces of the chips.

(5) Firing

The chips were fired in a $N_2$ atmosphere in substantially the same manner as typical ceramic multilayer substrates. In the case in which an inert gas, such as Ar or Ne, is introduced into the cavity 13 to decrease the response voltage to ESD, the chips may preferably be fired in an atmosphere of the inert gas, such as Ar or Ne, in a temperature range in which the ceramic material is shrunk and sintered. If the electrode material (e.g., Ag) is not oxidized, the chips may be fired in the air.

The resin paste was eliminated through firing and the cavity 13 was formed. The organic solvent in the ceramic green sheets and the binder resin and solvent in the mixture paste were also eliminated through firing.

(6) Plating

Ni—Sn electroplating, for example, was performed on the external electrodes in substantially the same manner as chip-type electronic components such as LC filters.

The ESD protection device 10 including a section shown in FIGS. 1 to 3 was completed through the steps described above.

The semiconductor material is not particularly limited to the above-described material. Examples of the semiconductor material include metal semiconductors, such as silicon and germanium; carbides such as silicon carbide, titanium carbide, zirconium carbide, molybdenum carbide, and tungsten carbide; nitrides such as titanium nitride, zirconium nitride, chromium nitride, vanadium nitride, and tantalum nitride; silicides such as titanium silicide, zirconium silicide, tungsten silicide, molybdenum silicide, and chromium silicide; borides such as titanium boride, zirconium boride, chromium boride, lanthanum boride, molybdenum boride, and tungsten boride; and oxides such as zinc oxide and strontium titanate. In particularly, silicon or silicon carbide is preferable because it is relatively inexpensive and has commercially available variations with a variety of particle sizes. These semiconductor materials may be suitably used alone or in combination, and may be suitably used as a mixture with a resistive material such as alumina or a BAS material.

which no delamination was observed was defined as "good". The case in which one or more delamination was observed was defined as "poor".

Discharge responsivity to ESD was also evaluated. The discharge responsivity to ESD was measured using an electrostatic discharge immunity test provided in IEC61000-4-2, which is the standard of IEC. When 8 kV was applied using contact discharge, whether discharge was generated between the discharge electrodes of samples was measured. When a peak voltage detected on a protection circuit side was greater than about 700 V, the discharge responsivity was defined as "poor". When the peak voltage was in the range of about 500 V to about 700 V, the discharge responsivity was defined as "good". When the peak voltage was less than about 500 V, the discharge responsivity was particularly defined as "excellent".

ESD cyclic durability was also evaluated. After ten 2 kV applications, ten 3 kV applications, ten 4 kV applications, ten 6 kV applications, and ten 8 kV applications were performed using contact discharge, the discharge responsivity to ESD was evaluated. When a peak voltage detected on a protection circuit side was more than about 700 V, the ESD cyclic durability was defined as "poor". When the peak voltage was in the range of about 500 V to about 700 V, the ESD cyclic durability was defined as "good". When the peak voltage was less than about 500 V, the ESD cyclic durability was particularly defined as "excellent".

Table 2 shows the conditions of the mixture paste of silicon carbide powder/Cu powder and the evaluation results.

TABLE 2

| Sample No. | Volume ratio (vol %) Silicon carbide powder | Cu powder | Short circuit characteristic | Delamination | Discharge responsivity to ESD | ESD cyclic durability | Overall evaluation |
|---|---|---|---|---|---|---|---|
| *1 | 100 | 0 | good | poor | good | good | poor |
| 2 | 90 | 10 | good | good | excellent | excellent | excellent |
| 3 | 80 | 20 | good | good | excellent | excellent | excellent |
| 4 | 70 | 30 | good | good | excellent | good | good |
| 5 | 60 | 40 | good | good | excellent | good | good |
| 6 | 50 | 50 | good | good | excellent | good | good |
| 7 | 40 | 60 | poor | poor | — | — | poor |
| 8 | 30 | 70 | poor | poor | — | — | poor |
| 9 | 20 | 80 | poor | poor | — | — | poor |
| 10 | 10 | 90 | poor | poor | — | — | poor |
| *11 | 0 | 100 | poor | poor | — | — | poor |

*Outside the scope of the present invention

The metal material is not particularly limited to the above-described material, and may include Cu, Ag, Pd, Pt, Al, Ni, W, or Mo or an alloy or combination thereof, for example.

The resin paste was applied to form the cavity 13. However, a material, such as carbon, that is eliminated through firing may be used instead of a resin. Moreover, a resin paste is not necessarily applied by a printing method, and a resin film to form the cavity 13 may be simply pasted at a desired position.

One hundred samples of the ESD protection device 10 were evaluated for short circuits between the discharge electrodes 16 and 18 and the presence or absence of delamination after firing by observing the internal sections thereof. The term "delamination" herein means detachment between the supporting electrode and discharge electrodes or between the supporting electrode and the ceramic multilayer substrate. When the incidence of short circuits was about 40% or less, the short circuit characteristic was defined as "good". When the incidence of short circuits was more than about 40%, the short circuit characteristic was defined as "poor". The case in As is clear from Table 2, in the ESD protection devices with Sample Nos. 2 to 6 having a volume ratio of Cu powder of about 10% to about 50%, no delamination occurred and they were excellent in short circuit characteristic, discharge responsivity to ESD, and ESD cyclic durability.

On the other hand, in the ESD device with Sample No. 1, the supporting electrode includes only silicon carbide powder. Therefore, the connection between the discharge electrodes and the supporting electrode was poor, which caused delamination between the discharge electrodes and the supporting electrode. This ESD protection device had little practical utility.

In the ESD protection devices with Sample Nos. 7 to 11, since the content of Cu powder was high, the supporting electrode and the ceramic multilayer substrate were not sintered in a synchronized manner, which caused delamination. Furthermore, the incidence of short circuits caused by contact between particles of Cu powder was markedly high. Thus, these ESD protection devices had little practical utility.

Example 2

Figure 4:
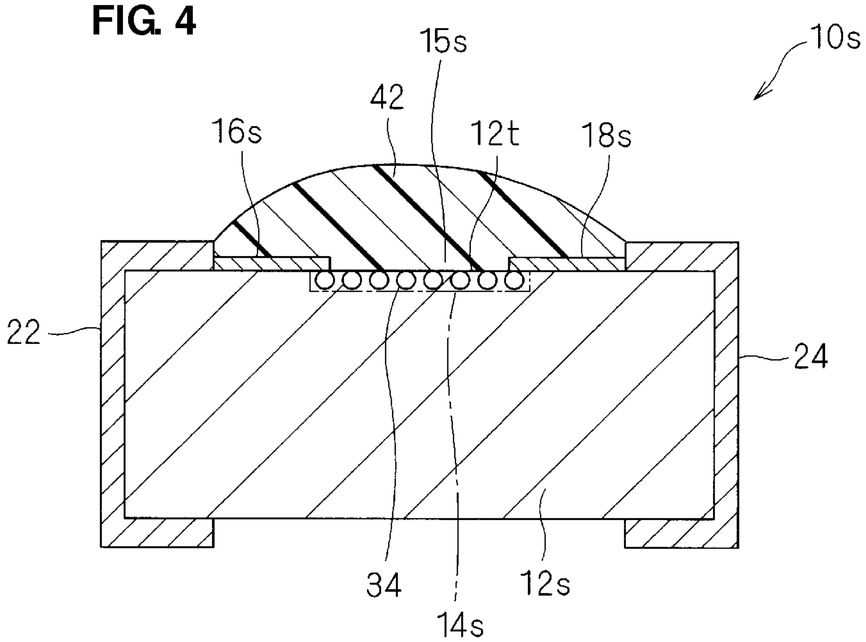
FIG. 4 is a sectional view of an Example 2 of an ESD protection device according to a preferred embodiment of the present invention.
Figure 5:
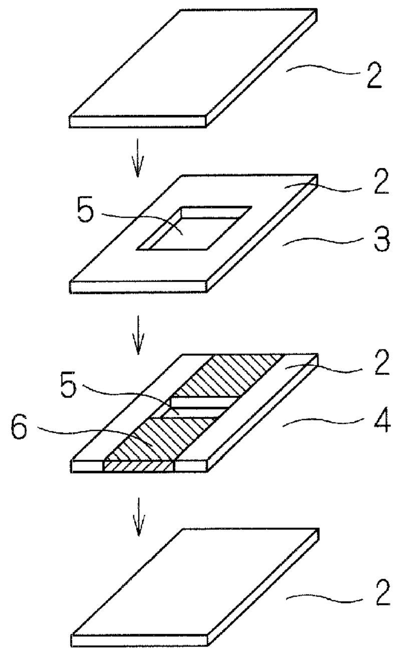
FIG. 5 PRIOR ART
FIG. 5 is an exploded perspective view of a known ESD protection device.
Figure 6:
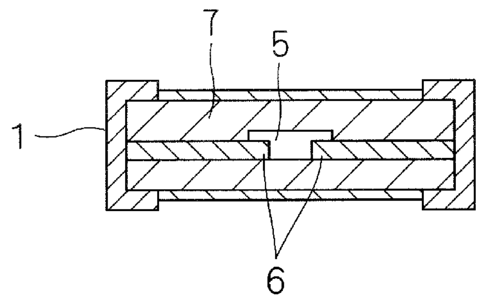
FIG. 6 PRIOR ART
FIG. 6 is a sectional view of the known ESD protection device.

An ESD protection device 10*s* of Example 2 according to a preferred embodiment of the preset invention will be described with reference to FIG. 4. FIG. 4 is a sectional view of the ESD protection device 10*s*.

The ESD protection device 10*s* of Example 2 has substantially the same structure as that of the ESD protection device 10 of Example 1. The same components and elements as those in Example 1 are designated by the same reference numerals, and the differences between the ESD protection device 10 of Example 1 and the ESD protection device 10*s* of Example 2 are primarily described.

As shown in FIG. 4, the ESD protection device 10*s* of Example 2 is substantially the same as the ESD protection device of Example 1 except that the ESD protection device 10*s* preferably does not include the cavity 13. That is to say, the ESD protection device 10*s* of Example 2 preferably includes a pair of discharge electrodes 16*s* and 18*s* that face each other that are provided on an upper surface 12*t* of a ceramic multilayer substrate 12*s* and are covered with a resin 42.

The discharge electrodes 16*s* and 18*s* are preferably arranged so as to face each other with a space 15*s* therebetween as in the ESD protection device 10 of Example 1. On the upper surface 12*t* side of the ceramic multilayer substrate 12*s*, a supporting electrode 14*s* in which a metal material 34 and a semiconductor material (not shown) are dispersed is preferably arranged so as to be in contact with a region in which the space 15*s* between the discharge electrodes 16*s* and 18*s* is provided and its adjacent region. That is, the supporting electrode 14*s* is preferably arranged in the region that connects the discharge electrodes 16*s* and 18*s*. The discharge electrodes 16*s* and 18*s* are preferably respectively connected to external electrodes 22 and 24 provided on the surface of the ceramic multilayer substrate 12*s*.

A manufacturing example of Example 2 will now be described. The ESD protection device of Example 2 was manufactured by substantially the same method as that of the ESD protection device of Example 1. However, the resin paste was not applied because the ESD protection device of Example 2 does not include a cavity.

Table 3 shows the conditions of the mixture paste of silicon carbide powder/Cu powder and the evaluation results.

TABLE 3

| Sample No. | Volume ratio (vol %) Silicon carbide powder | Volume ratio (vol %) Cu powder | Short circuit characteristic | Delamination | Discharge responsivity to ESD | ESD cyclic durability | Overall evaluation |
|---|---|---|---|---|---|---|---|
| *1 | 100 | 0 | good | poor | good | good | poor |
| 2 | 90 | 10 | good | good | good | good | good |
| 3 | 80 | 20 | good | good | good | good | good |
| 4 | 70 | 30 | good | good | good | good | good |
| 5 | 60 | 40 | good | good | good | good | good |
| 6 | 50 | 50 | good | good | good | good | good |
| 7 | 40 | 60 | poor | poor | — | — | poor |
| 8 | 30 | 70 | poor | poor | — | — | poor |
| 9 | 20 | 80 | poor | poor | — | — | poor |
| 10 | 10 | 90 | poor | poor | — | — | poor |
| *11 | 0 | 100 | poor | poor | — | — | poor |

*Outside the scope of the present invention

As is clear from a comparison between Tables 2 and 3, although the ESD protection device of Example 2 that does not include a cavity and has a volume ratio of Cu power of about 10% to about 50% (Sample Nos. 2 to 6 in Table 3) had practical utility, the discharge responsivity to ESD tended to decrease as compared to that of the ESD protection device of Example 1 that includes a cavity (Sample Nos. 2 to 6 in Table 2). It is believed that the ESD protection device of Example 1 including a cavity has better discharge responsivity to ESD because creeping discharge is generated along the supporting electrode of the discharge electrodes when ESD is applied.

The ESD protection devices with Sample Nos. 1 and 7 to 11 in Table 3 had little practical utility for the same reasons as that described in Example 1.

Example 3

An ESD protection device of Example 3 will be described. In a manufacturing example of the ESD protection device of Example 3, the ESD protection device was manufactured by substantially the same method as that of the ESD protection device of Example 1, except that silicon powder was preferably used instead of silicon carbide as the semiconductor material. The particle size of silicon powder was preferably about 1 μm, for example.

Table 4 shows the conditions of the mixture paste of silicon powder/Cu powder and the evaluation results.

TABLE 4

| | Volume ratio (vol %) | | | | Discharge | ESD | |
|---|---|---|---|---|---|---|---|
| Sample No. | Silicon powder | Cu powder | Short circuit characteristic | Delamination | responsivity to ESD | cyclic durability | Overall evaluation |
| *1 | 100 | 0 | good | poor | good | good | poor |
| 2 | 90 | 10 | good | good | excellent | excellent | excellent |
| 3 | 80 | 20 | good | good | excellent | excellent | excellent |
| 4 | 70 | 30 | good | good | excellent | good | good |
| 5 | 60 | 40 | good | good | excellent | good | good |
| 6 | 50 | 50 | good | good | excellent | good | good |
| 7 | 40 | 60 | poor | poor | — | — | poor |
| 8 | 30 | 70 | poor | poor | — | — | poor |
| 9 | 20 | 80 | poor | poor | — | — | poor |
| 10 | 10 | 90 | poor | poor | — | — | poor |
| *11 | 0 | 100 | poor | poor | — | — | poor |

*Outside the scope of the present invention

As is clear from Table 4, in the ESD protection devices with Sample Nos. 2 to 6 having a volume ratio of Cu powder of about 10% to about 50%, no delamination occurred and they had an excellent short circuit characteristic, discharge responsivity to ESD, and ESD cyclic durability.

The ESD protection devices with Sample Nos. 1 and 7 to had little practical utility for the same reason as that described in Example 1.

Example 4

An ESD protection device of Example 4 will be described.

The ESD protection device of Example 4 is substantially the same as that of Example 1 except that the supporting electrode also preferably includes a ceramic material.

In a manufacturing example of the ESD protection device of Example 4, the ESD protection device was manufactured by substantially the same method as that of the manufacturing example of Example 1, except that a mixture paste including BAS material-calcined ceramic powder, silicon carbide powder, and Cu powder, for example, was preferably used. The average particle size of the BAS material-calcined ceramic powder was preferably about 1 μm, for example. The average particle size of the silicon carbide powder was preferably about 1 μm, for example, The average particle size of the Cu powder was preferably about 3 μm, for example.

Table 5 shows the conditions of the mixture paste of BAS material-calcined ceramic powder/silicon carbide powder/Cu powder and the evaluation results.

TABLE 5

| | Volume ratio (vol %) | | | | | | | |
|---|---|---|---|---|---|---|---|---|
| Sample No. | BAS material powder | Silicon carbide powder | Cu powder | Short circuit characteristic | Delamination | Discharge responsivity to ESD | ESD cyclic durability | Overall evaluation |
| 1 | 0 | 50 | 50 | good | good | excellent | good | good |
| 2 | 5 | 45 | 50 | good | good | excellent | excellent | excellent |
| 3 | 10 | 40 | 50 | good | good | excellent | excellent | excellent |
| 4 | 25 | 25 | 50 | good | good | excellent | excellent | excellent |
| *5 | 50 | 0 | 50 | poor | good | — | — | poor |
| 6 | 0 | 70 | 30 | good | good | excellent | good | good |
| 7 | 20 | 50 | 30 | good | good | excellent | excellent | excellent |
| 8 | 40 | 30 | 30 | good | good | excellent | excellent | excellent |
| 9 | 60 | 10 | 30 | good | good | excellent | excellent | excellent |
| *10 | 70 | 0 | 30 | poor | good | — | — | poor |

*Outside the scope of the present invention

It is clear from Table 5 that since the ESD protection devices with Sample Nos. 2 to 4 and 6 to 9 include the BAS material-calcined ceramic powder, silicon carbide, which is a semiconductor material, and Cu powder, which is a conductive material, are firmly fixed to the ceramic multilayer substrate, which improves ESD cyclic durability.

In the ESD protection devices with Sample Nos. 5 and 10, a large amount of glass component was formed during firing due to the BAS material-calcined ceramic powder, and Cu powder particles were partially subjected to liquid-phase sintering due to the glass component, which often caused short circuits. Therefore, such ESD protection devices had little practical utility.

The resistive material is not particularly limited to the material described above, and such a resistive material may be a mixture of forsterite and glass, a mixture of $CaZrO_3$ and glass, or other suitable resistive material, for example. To prevent delamination and to improve ESD cyclic durability, the resistive material is preferably the same as the ceramic material that defines at least one layer of the ceramic multilayer substrate.

Example 5

An ESD protection device of Example 5 will be described.

The ESD protection device of Example 5 is substantially the same as that of Example 1, except that the ceramic multilayer substrate is preferably made by alternately laminating shrinkage suppression layers and base layers, that is, a non-shrinkage substrate is used as the ceramic multilayer substrate.

In a manufacturing example of the ESD protection device of Example 5, a paste for shrinkage suppression layers (e.g., composed of $Al_2O_3$ powder, glass frit, and an organic vehicle) is applied by screen printing, for example, on substantially the entire surface of the ceramic green sheet manufactured by substantially the same method as that of the manufacturing example of the ESD protection device of Example 1. The mixture paste is then preferably applied thereon in a desired pattern by screen printing to form the supporting electrode 14. Subsequently, the electrode paste is applied thereon to form the discharge electrodes 16 and 18 including the space 15 defining a discharge gap between the counter portions 17 and 19. Herein, the discharge electrodes 16 and 18 were preferably formed such that the width was about 100 μm, for example, and the discharge gap width (the size of the space 15 between the counter portions 17 and 19) was preferably about 30 μm, for example. The resin paste is then applied thereon to form the cavity 13. The paste for shrinkage suppression layers is applied thereon by screen printing, for example. The ceramic green sheet is laminated thereon and press-bonded. Subsequently, cutting, application of electrodes to end surfaces, firing, and plating are performed as in the manufacturing example of Example 1.

Table 6 shows the conditions of the mixture paste of silicon carbide powder/Cu powder and the evaluation results.

The advantages of various preferred embodiments of the present invention are as follows.

In a structure in which discharge electrodes are made of a metal material and a semiconductor material, high responsivity to ESD is achieved even if the content of the metal material is relatively low.

In a structure in which an ESD protection device includes a cavity, creeping discharge is produced, which further improves the responsivity to ESD.

By adding a ceramic material to the supporting electrode including the metal material and the semiconductor material, the metal material and the semiconductor material are firmly fixed to a ceramic multilayer substrate, whereby the ESD cyclic durability is improved.

When silicon carbide is used as the semiconductor material, an inexpensive and good ESD protection device is provided.

When Cu powder is used as the metal material, an inexpensive and good ESD protection device is provided.

The present invention is not limited to the preferred embodiments described above, and various modifications can be made.

TABLE 6

| | Volume ratio (vol %) | | | | Discharge | ESD | |
|---|---|---|---|---|---|---|---|
| Sample No. | Silicon carbide powder | Cu powder | Short circuit characteristic | Delamination | responsivity to ESD | cyclic durability | Overall evaluation |
| *1 | 100 | 0 | good | poor | good | good | poor |
| 2 | 90 | 10 | good | good | excellent | excellent | excellent |
| 3 | 80 | 20 | good | good | excellent | excellent | excellent |
| 4 | 70 | 30 | good | good | excellent | good | good |
| 5 | 60 | 40 | good | good | excellent | good | good |
| 6 | 50 | 50 | good | good | excellent | good | good |
| 7 | 40 | 60 | poor | poor | — | — | poor |
| 8 | 30 | 70 | poor | poor | — | — | poor |
| 9 | 20 | 80 | poor | poor | — | — | poor |
| 10 | 10 | 90 | poor | poor | — | — | poor |
| *11 | 0 | 100 | poor | poor | — | — | poor |

*Outside the scope of the present invention

As is clear from Table 6, the ESD protection devices with Sample Nos. 2 to 6 having a volume ratio of Cu powder of about 10% to about 50% are as good as the ESD protection device in the manufacturing example of Example 1. Furthermore, with a non-shrinkage substrate, an ESD protection device having high dimensional accuracy and very small warpage is provided.

The above-described ESD protection devices of Examples 1 to 5 of preferred embodiments of the present invention preferably include a supporting electrode obtained by dispersing at least a metal material and a semiconductor material in a region that connects discharge electrodes to each other. Therefore, electrons easily move and discharge is generated more efficiently, which improves the responsivity to ESD. This decreases the variation in the responsivity to ESD caused by the variation in the space between the discharge electrodes. Thus, ESD characteristics are easily adjusted and stabilized.

Furthermore, by adjusting the amounts and kinds of the metal material and the semiconductor material included in the supporting electrode, the discharge starting voltage can be set to a desired voltage. The discharge starting voltage can be set with high precision as compared to the case I which a discharge starting voltage is adjusted using only the space between the discharge electrodes.

For example, even if less than about 10 vol % of the metal material or more than about 50 vol % of the metal material is included in the supporting electrode, the functions as an ESD protection device can be achieved by suitably selecting the type and particle size of the metal material and the type and particle size of the semiconductor material.

Although the supporting electrode is preferably provided on the ceramic multilayer substrate side in Example 2, the supporting electrode may be provided on the resin side.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:

a ceramic multilayer substrate;

at least one pair of discharge electrodes provided in the ceramic multilayer substrate and facing each other with a space therebetween;

external electrodes provided on a surface of the ceramic multilayer substrate and connected to the discharge electrodes; and a supporting electrode including a metal material and a semiconductor material that are dispersed and arranged in a region that connects the at least one pair of discharge electrodes to each other.

2. The ESD protection device according to claim 1, wherein the semiconductor material is silicon carbide.

3. The ESD protection device according to claim 1, wherein the semiconductor material is silicon.

4. The ESD protection device according to claim 1, wherein a ceramic material that includes a material defining the ceramic multilayer substrate is also dispersed in the supporting electrode.

5. The ESD protection device according to claim 2, wherein the supporting electrode includes the metal material at a content of about 10 vol % to about 50 vol %.

6. The ESD protection device according to claim 1, wherein the ceramic multilayer substrate includes a cavity therein and the at least one pair of discharge electrodes are arranged along an inner surface of the cavity.

7. The ESD protection device according to claim 1, wherein the ceramic multilayer substrate includes alternately laminated first ceramic layers that are not substantially sintered and second ceramic layers that have been sintered.

* * * * *